United States Patent
Song et al.

[11] Patent Number: 5,851,918
[45] Date of Patent: Dec. 22, 1998

[54] METHODS OF FABRICATING LIQUID CRYSTAL DISPLAY ELEMENTS AND INTERCONNECTS THEREFOR

[75] Inventors: Jin-ho Song, Kyungki-do; Won-joo Kim, Seoul, both of Rep. of Korea

[73] Assignee: Samsung Electronics Co., Ltd., Suwon, Rep. of Korea

[21] Appl. No.: 754,886

[22] Filed: Nov. 22, 1996

[30] Foreign Application Priority Data

Nov. 23, 1995 [KR] Rep. of Korea ............... 95-43201

[51] Int. Cl.$^6$ ................................................ H01L 21/44
[52] U.S. Cl. .................. 438/627; 438/627; 438/643; 438/609; 438/608; 438/678; 349/152
[58] Field of Search .................... 438/627, 643, 438/609, 608, 341, 678; 349/152, 139, 143

[56] References Cited

U.S. PATENT DOCUMENTS

| | | | |
|---|---|---|---|
| 3,989,606 | 11/1976 | Kampert | 204/33 |
| 4,205,428 | 6/1980 | Ernstoff et al. | 29/592 |
| 4,325,990 | 4/1982 | Ferrier | 427/305 |
| 5,260,234 | 11/1993 | Long | 437/203 |
| 5,384,284 | 1/1995 | Doan et al. | 437/190 |
| 5,543,946 | 8/1996 | Enomoto | 359/87 |

FOREIGN PATENT DOCUMENTS

| | | |
|---|---|---|
| 59-198271 | 6/1984 | Japan . |
| 61-239647 | 4/1985 | Japan . |
| 62-48047 | 8/1985 | Japan . |
| 62-158881 | 12/1985 | Japan . |
| 63-164447 | 12/1986 | Japan . |

OTHER PUBLICATIONS

S.Wolf & R. Tauber, "Silicon Processing for the VLSI Era" vol. 2, pp. 256–257, 1990.

*Primary Examiner*—Charles Bowers
*Assistant Examiner*—Thanh Nguyen
*Attorney, Agent, or Firm*—Myers Bigel Sibley & Sajovec

[57] ABSTRACT

Methods of fabricating a liquid crystal display element on a substrate includes forming a thin film transistor on the substrate, the thin film transistor including a gate electrode covered by a channel region and a gate pad conductively connected to the gate electrode. A pad electrode is formed on the substrate, spaced apart from the gate pad. A portion of the gate pad and a portion of the pad electrode are exposed, and the exposed portion of the gate pad selectively plated to thereby form a conductive barrier layer on the exposed portion of the gate pad. A pixel electrode is then formed contacting the conductive barrier layer and the exposed portion of the pad electrode to thereby connect the gate pad and the pad electrode. Preferably, the selective plating includes electroless plating the exposed portion of the gate pad to thereby form the conductive barrier layer.

35 Claims, 6 Drawing Sheets

METHODS OF FABRICATING LIQUID CRYSTAL DISPLAY ELEMENTS AND INTERCONNECTS THEREFOR

FIELD OF THE INVENTION

The present invention relates to methods of fabricating microelectronic devices, more particularly, to methods of fabricating liquid crystal display elements.

BACKGROUND OF THE INVENTION

Liquid crystal displays (LCDs) using thin film transistors (TFTs) as switching devices are widely used to provide flat panel displays for devices such as portable computer, televisions and the like, because LCDs tend to be lighter and thinner, and to consume less power than cathode ray tube (CRT) displays.

Figure 1:
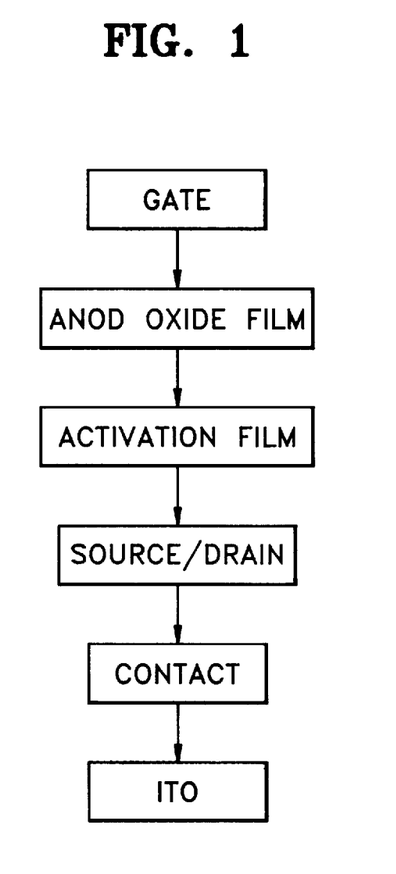
FIG. 1 is a flowchart illustrating operations of a conventional six-mask process for forming a liquid crystal display (LCD) element.

Various manufacturing techniques have been developed to reduce the cost of producing LCD's. A popular technique employs a six-mask process, as illustrated in FIG. 1. In contrast to a conventional seven-mask process, a passivation film and a gate insulating film are simultaneously etched during formation of a contact for a transparent indium tin oxide (ITO) pixel electrode using a fifth mask, and a previously formed pad electrode is connected to a gate pad using the ITO formed thereafter, allowing simultaneous formation of contacts between the pixel electrode and the pad electrode and between the pixel electrode and the gate pad.

Figure 2:
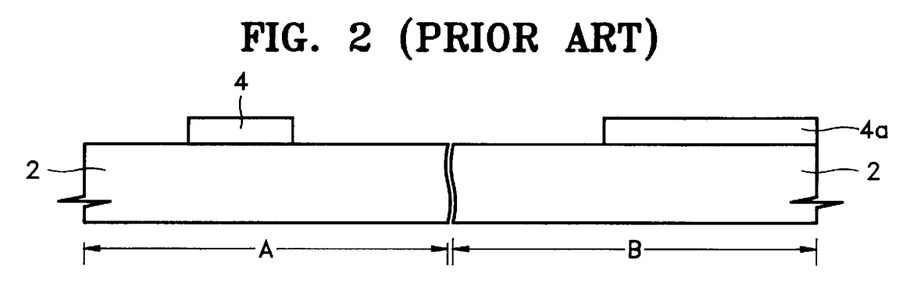
FIGS. 2–6 are cross-sectional views of intermediate fabrication products illustrating operations for fabricating an LCD element according to the prior art.
Figure 3:
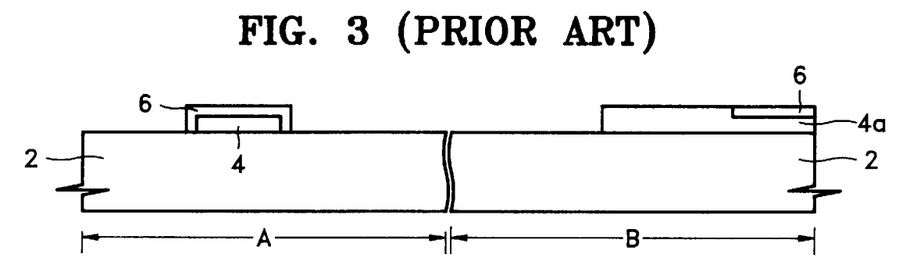
Figure 4:
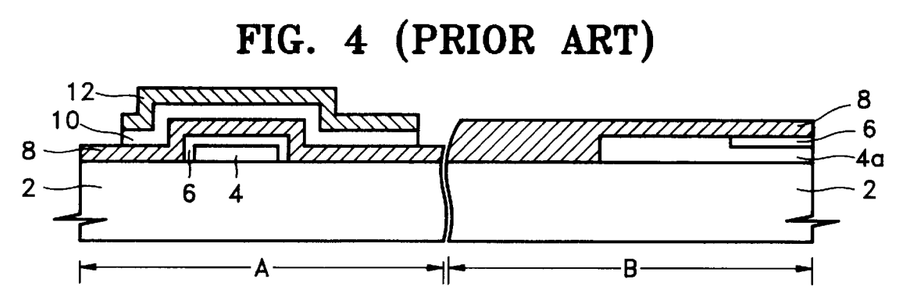

Operations for forming an LCD element according to a conventional six mask process will be described with reference to FIGS. 2–6, in which a reference designator A indicates an area of a transparent substrate 2 where a TFT is formed, and a reference designator B indicates an area of the substrate 2 where a pad electrode is formed. Referring to FIG. 2, an aluminum film is formed on the substrate 2. The aluminum film is then patterned to form a gate electrode 4 and a gate pad 4a. As shown in FIG. 3, the gate electrode 4 and the gate pad 4a are then selectively anodized, for example, using a photolithographic mask, to form an anode oxide film 6 which covers the gate electrode 4 and partially covers the gate pad 4a. As illustrated by FIG. 4, a silicon nitride film is deposited on the substrate 2, forming a gate insulating film 8. An amorphous silicon film and an impurity-doped amorphous silicon film are then consecutively deposited on the substrate 2. The silicon films are then patterned to form an amorphous silicon region 10 and a doped amorphous silicon region 12 in the TFT region A.

Figure 5:
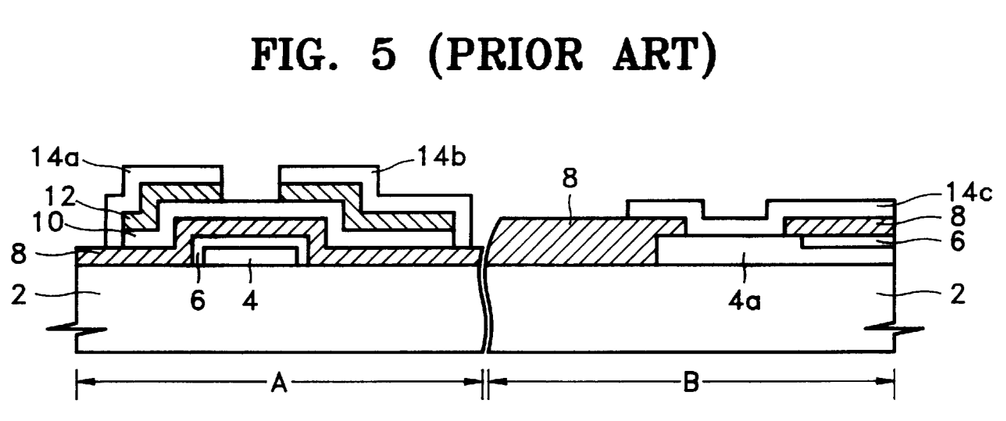
Figure 6:
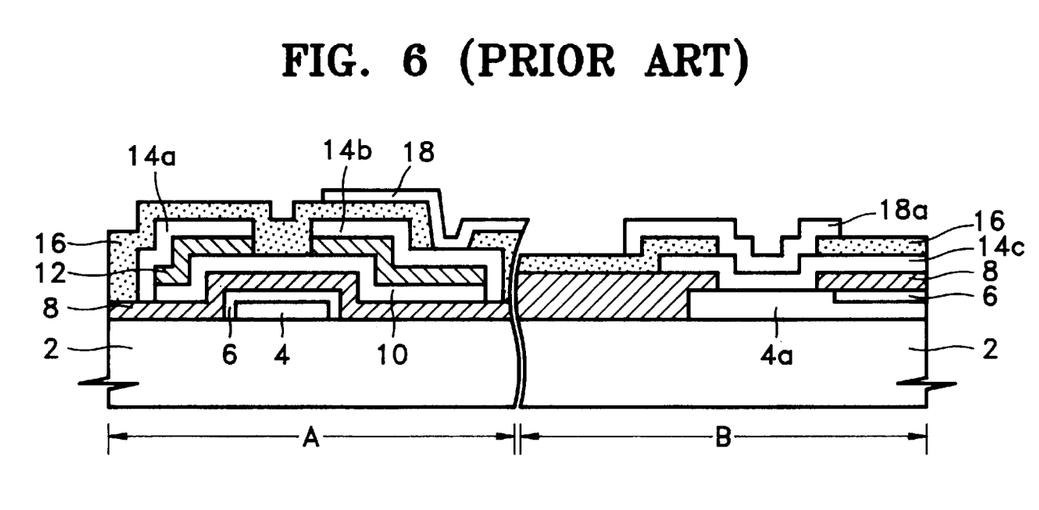

Referring to FIG. 5, a chromium (Cr) layer is deposited on the substrate 2. The chromium layer is then patterned to form a source electrode 14a and a drain electrode 14b, and to form a pad electrode 14c. Portions of the doped amorphous silicon region 12 overlying the gate electrode 4 typically are etched during the same operation, thus exposing a portion of amorphous silicon region 10 overlying the gate electrode 4. As illustrated in FIG. 6, a passivation film 16, typically an oxide film, is then deposited on the substrate 2, covering the source, drain, and pad electrodes 14a, 14b, 14c. The passivation film 16 is then patterned to expose a portion of the drain electrode 14b, a portion of the pad electrode 14c, and a portion of the gate pad 4a. Subsequently, a layer of indium tin oxide (ITO) is deposited on the substrate, contacting the exposed portions of the drain electrode 14b, the pad electrode 14c and the gate pad 4a. The ITO layer is then patterned to form pixel electrodes 18, 18a.

In an LCD element formed according to this conventional technique, degradation of the contact formed in the pad region B can occur due to contact between the aluminum gate pad 4a and the ITO pixel electrode 18a. A battery effect generated during development of the mask used to pattern the ITO film can cause portions of the ITO electrode 18a to melt. In addition, the contact may be further degraded by when drive currents arising during operation of the LCD element form an aluminum oxide film ($Al_2O_3$) on the aluminum contact, a problem which generally is not solved by replacing the aluminum with an aluminum alloy.

SUMMARY OF THE INVENTION

In light of the foregoing, it is an object of the present invention to provide methods of fabricating liquid crystal display (LCD) elements which are less prone to contact degradation.

This and other objects, features and advantages are provided according to the present invention by methods of fabricating LCD elements in which an interconnect between the gate pad of the thin film transistor of the LCD element and a pad electrode is formed by first selectively plating an exposed portion of the gate pad, preferably using an electroless plating technique in which the plating material selectively forms on the gate pad rather than on the pad electrode, and then forming a pixel electrode contacting the barrier layer and the pad electrode. Preferably, the gate pad is aluminum, the pad electrode is chromium, the barrier layer is nickel and the pixel electrode is indium tin oxide (ITO). The electroless plating preferably is performed by treating the exposed portion of the gate pad with a hypophosphite-based nickel electrolyte solution, more preferably at a temperature range of about 70° C. to about 110° C. and at a pH range of about 4.0 to about 5.0. Before plating, the exposed surface of the gate pad preferably is activated using a zincate solution or a palladium solution.

In particular, according to the present invention, a method of fabricating a liquid crystal display element on a substrate includes forming a thin film transistor on the substrate, the thin film transistor including a gate electrode covered by a channel region and a gate pad conductively connected to the gate electrode. A pad electrode is formed on the substrate, spaced apart from the gate pad. A portion of the gate pad and a portion of the pad electrode are exposed, and the exposed portion of the gate pad selectively plated to thereby form a conductive barrier layer on the exposed portion of the gate pad. A pixel electrode is then formed contacting the conductive barrier layer and the exposed portion of the pad electrode to thereby connect the gate pad and the pad electrode. Preferably, the step of selectively plating includes electroless plating the exposed portion of the gate pad to thereby form the conductive barrier layer.

The thin film transistor is preferably formed by forming a first conductive layer on the substrate and patterning the first conductive layer to form a gate electrode and a gate electrode pad spaced apart from and conductively connected to the gate electrode. An anode oxide film is then formed, covering the gate electrode, and an insulation layer is formed on the substrate, covering the anode oxide film and the gate electrode pad. A first semiconductor layer is formed on the insulation layer, and a second semiconductor layer is formed on the first semiconductor layer. The first and second semiconductor layers are then patterned to expose portions of the insulation layer and to leave a first semiconductor region overlying the gate electrode and a second semiconductor region overlying the first semiconductor region. A second conductive layer is formed covering the second semiconductor region and the first insulation region, and then the second conductive layer and the second semiconductor region are patterned to form spaced apart source/drain electrodes from the second conductive layer and underlying spaced apart source/drain regions from the second semiconductor region, to form a pad electrode on the insulation layer, and to expose a portion of the first semiconductor region disposed between the spaced apart source/drain regions. A passivation layer is then formed covering the source/drain electrodes, the exposed portion of the first semiconductor region and the pad electrode. To expose the gate pad and pad electrode, the passivation layer is then patterned.

Preferably, the first conductive layer is an aluminum layer, the insulation layer is a silicon nitride layer, the first semiconductor layer is an amorphous silicon layer, the second semiconductor layer is an doped amorphous silicon layer, the second conductive layer is a chromium layer, and the passivation layer is a silicon nitride layer. The step of electroless plating preferably comprises the step of treating the exposed portion of the gate pad with an electrolyte solution including nickel to thereby form a nickel barrier layer on the exposed portion of the gate pad, and the step of forming a pixel electrode comprises the step of forming an indium tin oxide pixel electrode contacting the nickel barrier layer and the exposed portion of the pad electrode. The patterning of the passivation layer may be performed with a photoresist mask which is left in place during the electroless plating step and subsequently removed. Residues formed on the passivation layer during the plating step may be using a nitrogen plasma, before the pixel electrode is formed.

The electrolyte solution used in the electroless plating process preferably comprises a hypophosphite-based nickel electrolyte solution, and the electroless plating of the gate pad preferably occurs by treating the exposed portion of the gate pad with the hypophosphite-based nickel electrolyte solution at a temperature range of about 70° C. to about 110° C. and at a Ph range of about 4.0 to about 5.0. Preferably, the plating is preceded by activating the exposed portion of the gate pad. The exposed portion of the gate pad may be activated by treating the gate pad with a zincate solution, preferably including zinc oxide and sodium hydroxide, and more preferably, further including zinc, iron, copper and nickel. Activation may also be performed using a palladium solution. An interconnect is thereby provided which offers reduced likelihood of contact degradation.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and like numbers refer to like elements throughout.

Method aspects of the present invention will now be described with reference to FIGS. 7–12, wherein reference designator C indicates a region of a substrate 22 at which a thin film transistor (TFT) is formed and reference designator D indicates a region of the substrate 22 at which a gate pad and pad electrode for the TFT are to be formed. According to the preferred method aspects for fabricating a liquid crystal display (LCD) element described herein, the substrate 22 preferably is transparent. Although the following description relates to fabrication of an LCD element, those skilled in the art will appreciate that the present invention is also applicable to formation of interconnects for other microelectronic devices formed on various types of substrates.

Figure 7:
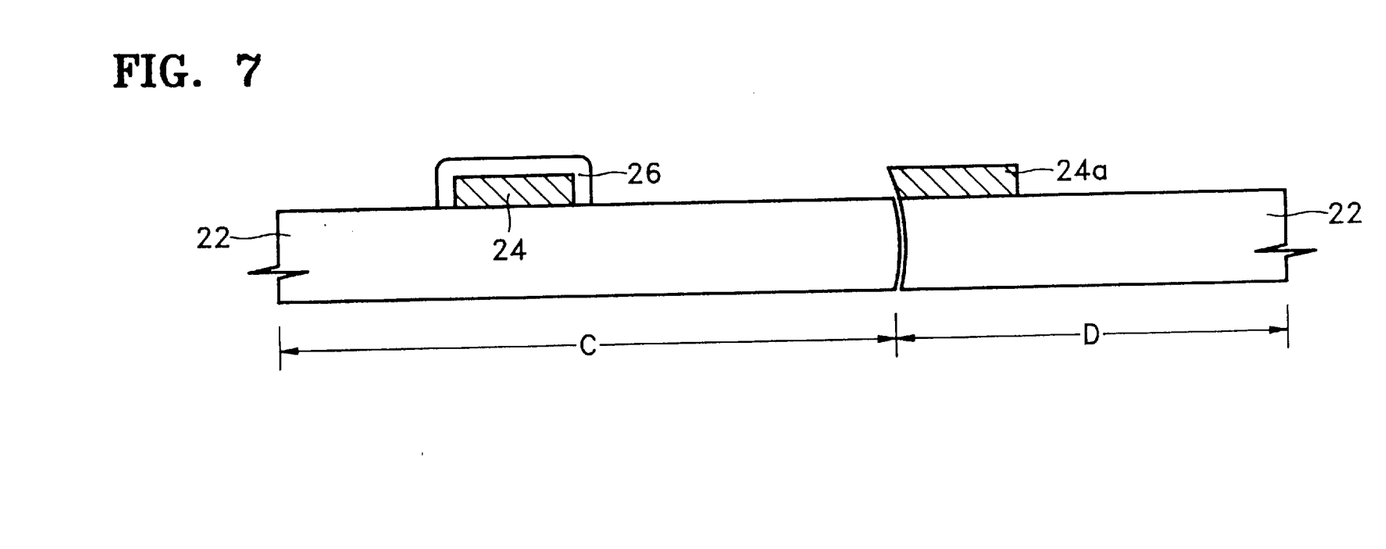
FIGS. 7–12 are cross-sectional views of intermediate fabrication products illustrating operations for fabricating an LCD element according to the present invention.
Figure 8:
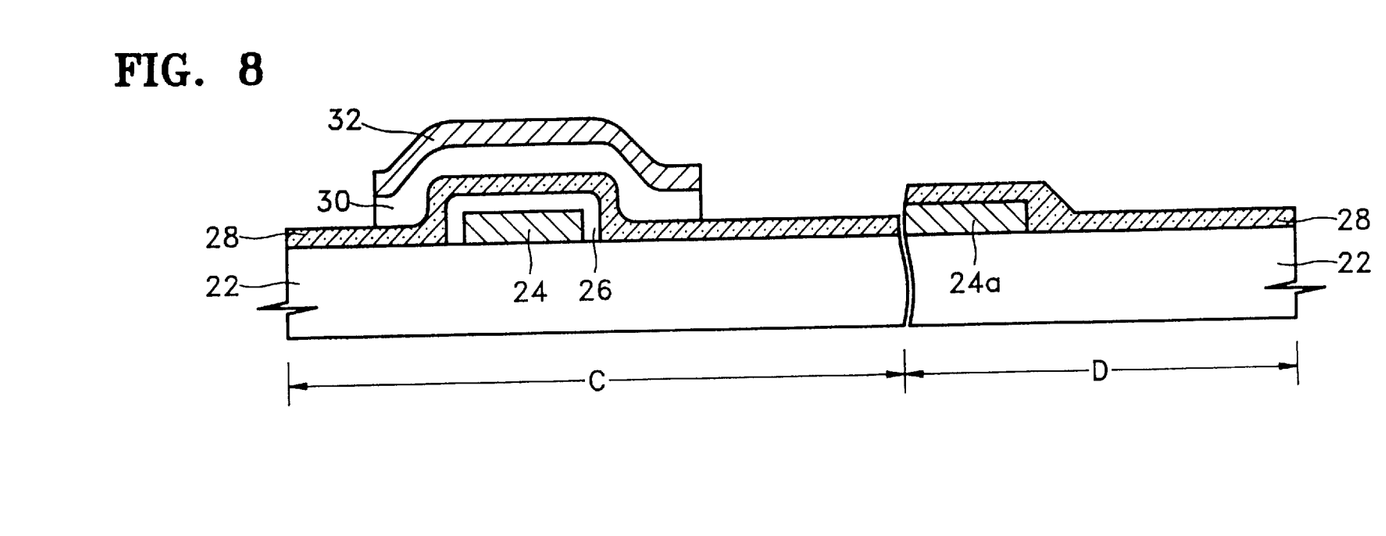

Referring to FIG. 7, a first conductive layer is formed on the substrate 22, preferably from aluminum (Al). The first conductive layer is then patterned to form a gate electrode 24 and a gate pad 24a. An anode oxide film 26 is then formed, covering the gate electrode 24. As shown in FIG. 8, an insulating material, preferably silicon nitride, is deposited on the substrate 22, forming an insulation layer 28. A first semiconductor layer, preferably amorphous silicon, and a second semiconductor layer, preferably impurity-doped amorphous silicon, are then sequentially formed on the substrate 22. The semiconductor layers are then patterned to form a first semiconductor region 30, which serves as a channel region for the TFT and a second semiconductor region 32 overlying the gate electrode 24.

Figure 9:
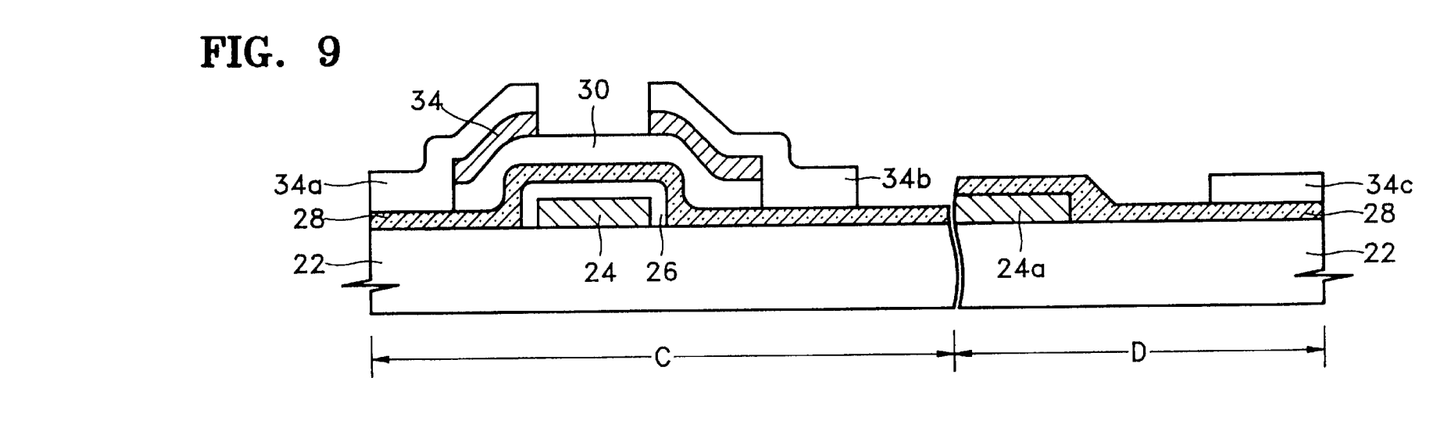
Figure 10:
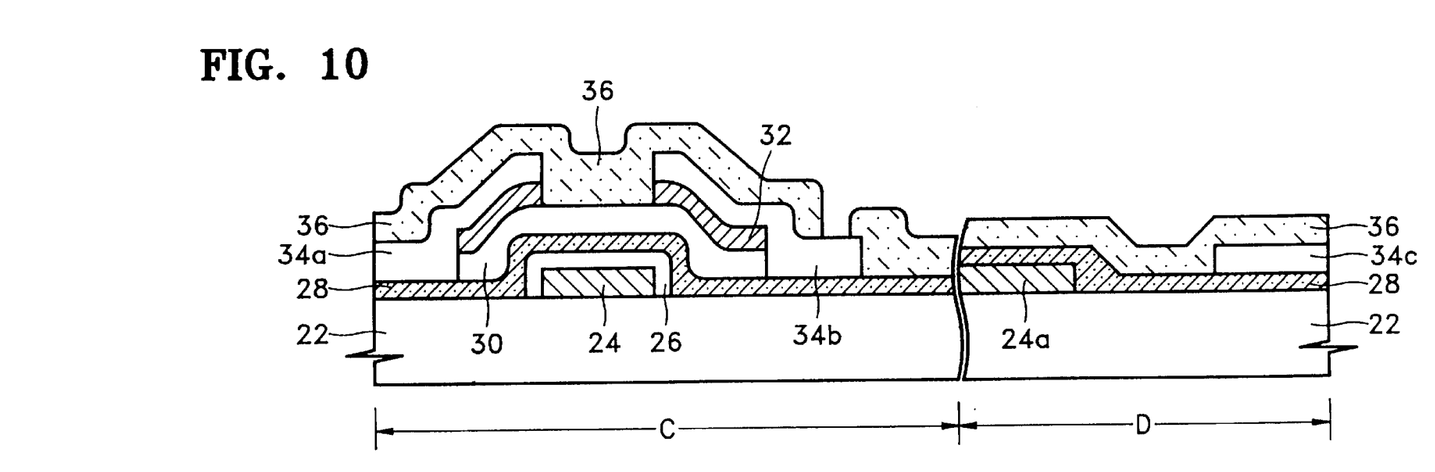
Figure 11:
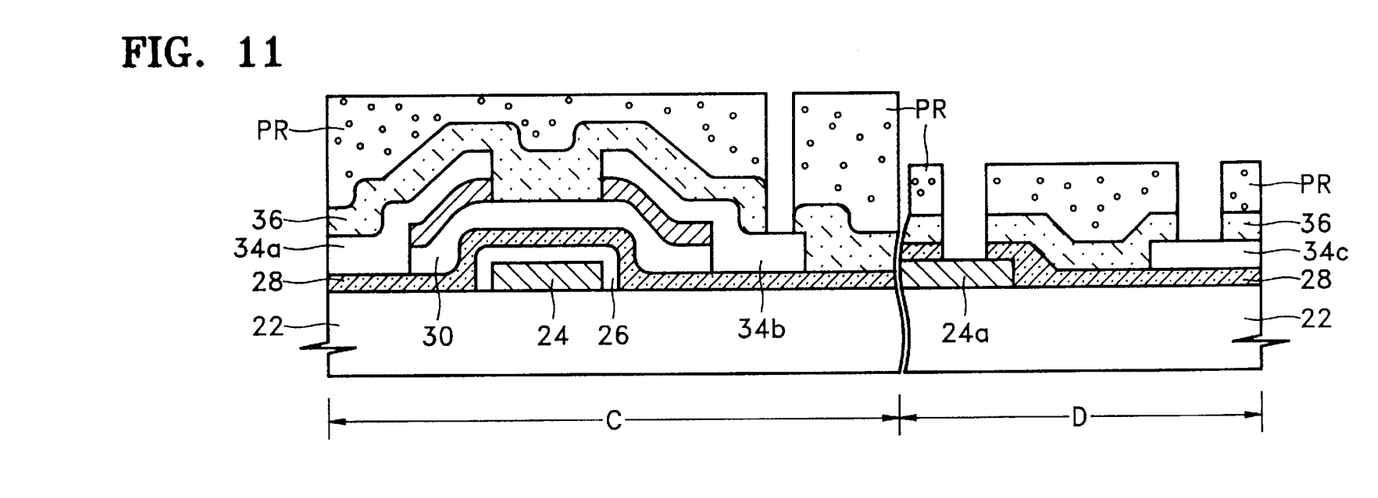

Referring to FIG. 9, a second conductive layer, preferably chromium (Cr), is deposited on the substrate 22, and then the second conductive layer and the second semiconductor region are patterned to form spaced apart source/drain electrodes 34a, 34b overlying spaced apart source/drain regions 32a, 32b in the TFT region C, and to form a pad electrode 34c in the pad region D. As shown in FIGS. 10–11, an insulating material, preferably silicon nitride, is then deposited on the substrate 22, forming a passivation layer 36. The passivation layer 36 is then patterned using a photoresist mask PR, exposing portions of the drain electrode 34b, the gate pad 24a and the pad electrode 34c.

Figure 12:
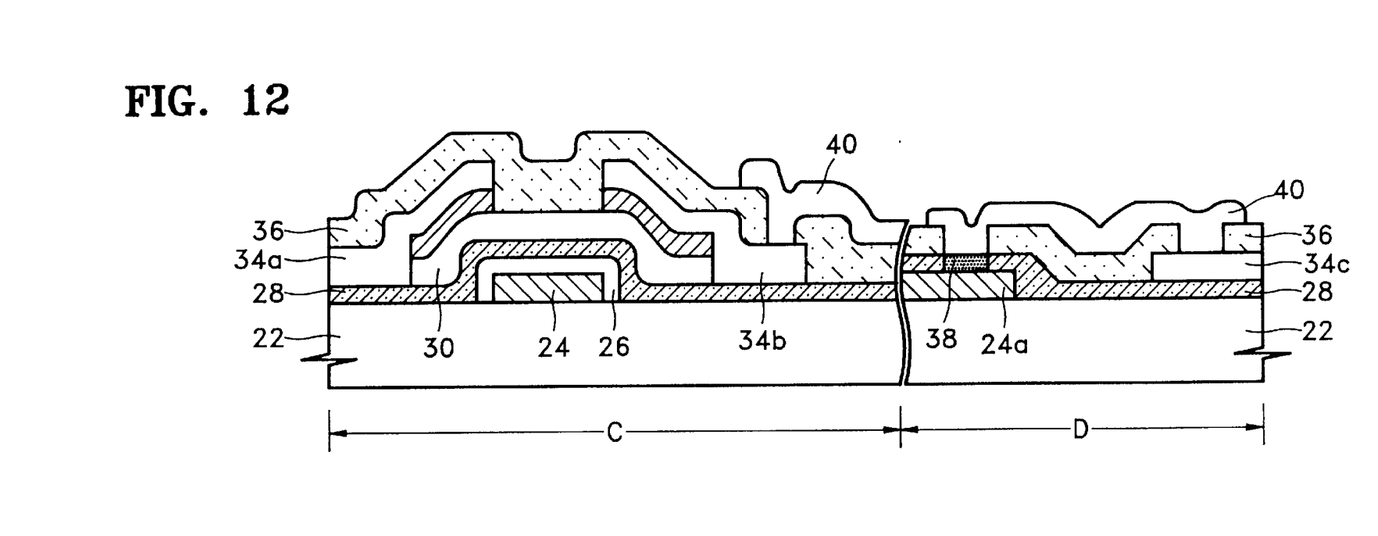

As illustrated in FIG. 12, a conductive barrier layer 38 is then formed on the exposed portion of the gate pad 24a, preferably using an electroless plating method. As will be appreciated by those skilled in the art, plating involves forming a film, for example, a metal film, on a surface by reducing plating ions from a solution containing the ions. Plating techniques include electroplating, electroless plating, and displacement plating, which generally differ in the way in which the plating ions are supplied.

According to preferred method aspects of the invention, electroless plating is used to take advantage of the property that the electrochemical potential of a reducing agent in a solution of metal ions is generally lower than that of the metal ions, thus causing oxidation of the reducing agent and reduction of the metal ions such that they are deposited on a substrate and thereby plate the substrate surface. The driving force of an electroless plating reaction can be explained by a difference of ionization tendencies, which can be expressed by the following reaction formulas:

Anodic reaction : $R+H_2O=O_x+e^-$

Cathodic reaction: $M^++e^-=M$, wherein R denotes a reducing agent. Electroless plating can be advantageous in that it typically generates a plated film having small amount of pinholes and excellent corrosion resistance. The plating films formed by electroless plating also tend to exhibit excellent uniformity and adhesiveness. A power supply is not needed, which can ease mass production. The plating process also tends to be highly selective, thus allowing surfaces of one material type to be plated without forming films on other surfaces. In addition, although electroless plating can be slower than electroplating, it generally is adequate for forming thin microelectronic layers having a thickness on the order of 500 Å.

Referring to FIG. 12, as contact resistance is generally increased and adhesive and mechanical integrity are degraded by the presence of an oxide film on the aluminum gate pad 24a, a cleaning step is preferably performed after the gate pad 24a is exposed. The exposed surface of the gate pad 24a then preferably is activated to remove a native oxide film from the surface of the gate pad and facilitate the electroless plating of nickel on the gate pad 24a.

Activation may be performed by treating the exposed surface of the gate pad 24a with a zincate solution, preferably a zincate solution including zinc oxide and sodium hydroxide as main components and preferably additionally containing zinc, iron, copper, and nickel to promote nucleation. The nucleation of the barrier layer can also be promoted by diluting the zincate solution with a deionized (DI) water. Activation may also be performed using a palladium (Pd) solution.

After activation of the surface of the gate pad 24a, a conductive barrier layer 38, preferably including nickel (Ni) is formed on the activated surface, preferably using a hypophosphite-based nickel (Ni) electrolyte. The activating step can be performed using a palladium (Pd) solution as well. The electroless plating of the nickel (Ni) metal preferably occurs at a temperature range of about 70° C. to about 110° C. and at a pH range of about 4.0 to about 5.0. Because of the different electrochemical properties of chromium and aluminum, plating selectively occurs on the aluminum gate electrode 24a at rate greater than that on the chromium pad electrode 34c, due to the small difference in ionization tendencies of chromium (Cr) and nickel (Ni).

The electroless plating may be performed before photoresist mask (PR) is removed. In this manner, the formation of a residue on the passivation layer 36 during the electroless plating can be prevented. An additional step of removing a surface portion of the passivation layer 36 using a nitrogen ($N_2$) plasma can be performed to remove residues formed on the passivation layer 36. As shown in FIG. 12, an indium tin oxide (ITO) layer may then be formed and patterned to form pixel electrodes 40.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of fabricating a liquid crystal display element on a substrate, the method comprising the steps of:
    forming a thin film transistor on the substrate, the thin film transistor including a gate electrode covered by a channel region and a gate pad conductively connected to the gate electrode;
    forming a pad electrode on the substrate, spaced apart from the gate pad;
    exposing a portion of the gate pad and a portion of the pad electrode;
    selectively plating the exposed portion of the gate pad to thereby form a conductive barrier layer on the exposed portion of the gate pad; and
    forming a pixel electrode contacting the conductive barrier layer and the exposed portion of the pad electrode to thereby connect the gate pad and the pad electrode.

2. A method according to claim 1, wherein said step of selectively plating comprises the step of electroless plating the exposed portion of the gate pad to thereby form the conductive barrier layer.

3. A method according to claim 2:
    wherein said step of forming a thin film transistor comprises the steps of:
        forming a first conductive layer on the substrate;
        patterning the first conductive layer to form a gate electrode and a gate pad spaced apart from and conductively connected to the gate electrode;
        forming an anode oxide film covering the gate electrode;
        forming a insulation layer on the substrate, covering the anode oxide film and the gate pad;
        forming a first semiconductor layer on the insulation layer;
        forming a second semiconductor layer on the first semiconductor layer;
        patterning the first and second semiconductor layers to expose portions of the insulation layer and to leave a first semiconductor region overlying the gate electrode and a second semiconductor region overlying the first semiconductor region;
        forming a second conductive layer covering the second semiconductor region and the first insulation region;
        patterning the second conductive layer and the second semiconductor region to form spaced apart source/drain electrodes from the second conductive layer and underlying spaced apart source/drain regions from the second semiconductor region, to form a pad electrode on the insulation layer, and to expose a portion of the first semiconductor region disposed between the spaced apart source/drain regions; and
        forming a passivation layer covering the source/drain electrodes, the exposed portion of the first semiconductor region and the pad electrode; and
    wherein said step of exposing comprises the step of patterning the passivation layer to expose a portion of the gate pad and a portion of the pad electrode.

4. A method according to claim 3, wherein the first conductive layer is an aluminum layer, wherein the insulation layer is a silicon nitride layer, wherein the first semiconductor layer is an amorphous silicon layer, wherein the second semiconductor layer is an doped amorphous silicon layer, wherein the second conductive layer is a chromium layer, wherein the passivation layer is a silicon nitride layer, and:
    wherein said step of electroless plating comprises the step of treating the exposed portion of the gate pad with an electrolyte solution comprising nickel to thereby form a nickel barrier layer on the exposed portion of the gate pad; and
    wherein said step of forming a pixel electrode comprises the step of forming an indium tin oxide pixel electrode contacting the nickel barrier layer and the exposed portion of the pad electrode.

5. A method according to claim 3:
wherein said step of patterning the passivation layer comprises the steps of:
forming a mask which leaves portions of the passivation layer overlying the gate pad and the pad electrode exposed; and
removing the exposed portions of the passivation layer to thereby expose a portion of the gate pad and a portion of the pad electrode;
wherein said step of electroless plating comprises the step of electroless plating the exposed portions of the gate pad and the pad electrode leaving the photoresist mask in place; and
wherein said step of forming a pixel electrode is preceded by the step of removing the mask.

6. A method according to claim 3, wherein said step of electroless plating is followed by and said step of forming a pixel electrode is preceded by the step of removing a surface portion of the passivation layer using a nitrogen plasma.

7. A method of fabricating a liquid crystal display element on a substrate, the method comprising the steps of:
forming a thin film transistor on the substrate, the thin film transistor including a gate electrode covered by a channel region, and a gate pad of a first metal, conductively connected to the gate electrode;
forming a pad electrode of a second metal on the substrate, spaced apart from the gate pad;
exposing a portion of the gate pad and a portion of the pad electrode;
selectively plating the exposed portion of the gate pad with a third metal to thereby form a conductive barrier layer of the third metal on the gate pad; and
forming a pixel electrode contacting the conductive barrier layer and the exposed portion of the pad electrode to thereby interconnect the gate pad and the pad electrode.

8. A method according to claim 7, wherein said step of selectively plating comprises the step of electroless plating the exposed portion of the gate pad with the third metal to thereby form the conductive barrier layer.

9. A method according to claim 8, wherein said step of electroless plating comprises the step of treating the exposed portions of the gate pad and the pad electrode with an electrolyte solution comprising the third metal to thereby form the conductive barrier layer on the exposed portion of the gate pad, wherein the third metal is plated on the first metal at a rate greater than the third metal is plated on the second metal, when treated with the electrolyte solution.

10. A method according to claim 9, wherein the first metal is aluminum, wherein the second metal is chromium, and wherein the electrolyte solution comprises nickel.

11. A method according to claim 10, wherein the electrolyte solution comprises a hypophosphite-based nickel electrolyte solution.

12. A method according to claim 11, wherein said step of treating comprises the step of treating the exposed portion of the gate pad with a hypophosphite-based nickel electrolyte solution at a temperature range of about 70° C. to about 110° C. and at a pH range of about 4.0 to about 5.0.

13. A method according to claim 10, wherein said step of treating is preceded by the step of activating the exposed portion of the gate pad.

14. A method according to claim 13, wherein said step of activating comprises the step of treating the gate pad with a zincate solution.

15. A method according to claim 14, wherein the zincate solution comprises zinc oxide and sodium hydroxide.

16. A method according to claim 15, wherein the zincate solution further comprises zinc, iron, copper and nickel.

17. A method according to claim 13, wherein said step of activating comprises the step of treating the gate pad with a palladium solution.

18. A method according to claim 8:
wherein said step of exposing a portion of the gate pad and a portion of the pad electrode is preceded by the step of forming an passivation layer covering the thin film transistor and the pad electrode;
wherein said step of exposing comprises the steps of:
forming a photoresist mask on the passivation layer leaving portions of the passivation layer overlying the gate pad and the pad electrode exposed; and
patterning the passivation layer according to the photoresist mask to expose a portion of the gate pad and a portion of the pad electrode;
wherein said step of electroless plating comprises the step of electroless plating the exposed portion of the gate pad with the photoresist mask in place; and
wherein said step of forming a pixel electrode is preceded by the step of removing the photoresist mask.

19. A method according to claim 8:
wherein said step of exposing a portion of the gate pad and a portion of the pad electrode is preceded by the step of forming an passivation layer covering the thin film transistor and the pad electrode;
wherein said step of exposing comprises the step of patterning the passivation layer to expose a portion of the gate pad and a portion of the pad electrode; and
wherein said step of electroless plating is followed by and said step of forming a pixel electrode is preceded by the step of removing a surface portion of the passivation layer using a nitrogen plasma.

20. A method of fabricating an interconnection between a first conductive region on a substrate and a second conductive region on the substrate, spaced apart from the first conductive region, the method comprising the steps of:
selectively electroless plating the first conductive region to thereby form a conductive barrier layer on the first conductive region; and
forming an interconnecting region contacting the conductive barrier layer and the second conductive region to thereby interconnect the first conductive region and the second conductive region;
wherein the first conductive region comprises a first metal, wherein the second conductive region comprises a second metal, and wherein said step of electroless plating comprises the step of treating the first conductive region and the second conductive region with an electrolyte solution comprising a third metal to thereby form the conductive barrier layer on the first conductive region, wherein the third metal is plated on the first metal at a rate greater than the third metal is plated on the second metal, when treated with the electrolyte solution.

21. A method according to claim 20, wherein the first metal is aluminum, wherein the second metal is chromium, and wherein the electrolyte solution comprises nickel.

22. A method according to claim 21, wherein the electrolyte solution comprises a hypophosphite-based nickel electrolyte solution.

23. A method according to claim 22, wherein said step of treating comprises the step of treating the first conductive region with a hypophosphite-based nickel electrolyte solution at a temperature range of about 70° C. to about 110° C. and at a pH range of about 4.0 to about 5.0.

24. A method according to claim 21, wherein said step of treating is preceded by the step of activating a surface of the first conductive region.

25. A method according to claim 24, wherein said step of activating comprises the step of treating the first conductive region with a zincate solution.

26. A method according to claim 25, wherein the zincate solution comprises zinc oxide and sodium hydroxide.

27. A method according to claim 26, wherein the zincate solution further comprises zinc, iron, copper and nickel.

28. A method according to claim 24, wherein said step of activating comprises the step of treating the first conductive region with a palladium solution.

29. A method for fabricating a liquid crystal display element on a substrate, the method comprising the steps of:
   forming a thin film transistor on the substrate, the thin film transistor including a gate electrode covered by a channel region and a gate pad conductively connected to the gate electrode;
   exposing a portion of the gate pad;
   selectively plating the exposed portion of the gate pad to thereby form a conductive barrier layer on the exposed portion of the gate pad; and
   forming a pixel electrode contacting the conductive barrier layer.

30. A method according to claim 29, wherein said gate electrode comprises aluminum.

31. A method according to claim 29, wherein said step of selectively plating comprises the step of electroless plating the exposed portion of the gate pad.

32. A method according to claim 29, wherein said pixel electrode comprises indium tin oxide (ITO).

33. A method according to claim 29:
   wherein said step of forming a thin film transistor comprises the steps of:
      forming a first conductive layer on the substrate;
      patterning the first conductive layer to form a gate electrode and a gate pad spaced apart from and conductively connected to the gate electrode;
      forming an anode oxide film covering the gate electrode;
      forming a insulation layer on the substrate, covering the anode oxide film and the gate pad;
      forming a first semiconductor layer on the insulation layer;
      forming a second semiconductor layer on the first semiconductor layer;
      patterning the first and second semiconductor layers to expose portions of the insulation layer and to leave a first semiconductor region overlying the gate electrode and a second semiconductor region overlying the first semiconductor region;
      forming a second conductive layer covering the second semiconductor region and the first insulation region;
      patterning the second conductive layer and the second semiconductor region to form spaced apart source/drain electrodes from the second conductive layer and underlying spaced apart source/drain regions from the second semiconductor region, to form a pad electrode on the insulation layer, and to expose a portion of the first semiconductor region disposed between the spaced apart source/drain regions; and
      forming a passivation layer covering the source/drain electrodes, the exposed portion of the first semiconductor region and the pad electrode; and
   wherein said step of exposing comprises the step of patterning the passivation layer to expose a portion of the gate pad and a portion of the pad electrode.

34. A method according to claim 33, wherein the first conductive layer is an aluminum layer, wherein the insulation layer is a silicon nitride layer, wherein the first semiconductor layer is an amorphous silicon layer, wherein the second semiconductor layer is an doped amorphous silicon layer, wherein the second conductive layer is a chromium layer, wherein the passivation layer is a silicon nitride layer, and:
   wherein said step of electroless plating comprises the step of treating the exposed portion of the gate pad with an electrolyte solution comprising nickel to thereby form a nickel barrier layer on the exposed portion of the gate pad; and
   wherein said step of forming a pixel electrode comprises the step of forming an indium tin oxide pixel electrode contacting the nickel barrier layer and the exposed portion of the pad electrode.

35. A method according to claim 33:
   wherein said step of patterning the passivation layer comprises the steps of:
      forming a mask which leaves portions of the passivation layer overlying the gate pad and the pad electrode exposed; and
      removing the exposed portions of the passivation layer to thereby expose a portion of the gate pad and a portion of the pad electrode;
   wherein said step of electroless plating comprises the step of electroless plating the exposed portions of the gate pad and the pad electrode leaving the photoresist mask in place; and
   wherein said step of forming a pixel electrode is preceded by the step of removing the mask.

* * * * *